(12) United States Patent
Lee

(10) Patent No.: US 8,664,691 B2
(45) Date of Patent: Mar. 4, 2014

(54) SILICON PHOTOMULTIPLIER WITH TRENCH ISOLATION

(75) Inventor: Joon Sung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 87 days.

(21) Appl. No.: 13/330,501

(22) Filed: Dec. 19, 2011

(65) Prior Publication Data

US 2012/0153423 A1 Jun. 21, 2012

(30) Foreign Application Priority Data

Dec. 21, 2010 (KR) ........................ 10-2010-0131869

(51) Int. Cl.
*H01L 29/74* (2006.01)
*H01L 31/111* (2006.01)

(52) U.S. Cl.
USPC ........... 257/127; 257/292; 257/312; 257/322; 257/396; 257/E21.006; 257/E21.042; 257/E21.043; 257/E21.053; 257/E21.248; 257/E21.278; 257/E21.293; 257/E21.352; 257/E21.37; 257/E21.585

(58) Field of Classification Search
USPC ......... 257/127, 396, 288, 290, 292, 312, 322, 257/334, E21.006, E21.042, E21.043, 257/E21.053, E21.248, E21.267, E21.278, 257/E21.293, E21.352, E21.37, E21.585
See application file for complete search history.

(56) References Cited

U.S. PATENT DOCUMENTS

| | | | | |
|---|---|---|---|---|
| 7,718,972 B2 * | 5/2010 | Tsuda et al. | ........... | 250/367 |
| 7,759,623 B2 * | 7/2010 | Teshima et al. | ........... | 250/207 |
| 8,050,743 B2 * | 11/2011 | Daghighian | ........... | 600/431 |
| 8,304,736 B2 * | 11/2012 | Gagnon | ........... | 250/362 |
| 8,401,621 B2 * | 3/2013 | Buono et al. | ........... | 600/431 |

FOREIGN PATENT DOCUMENTS

| | | |
|---|---|---|
| RU | 1702831 A1 | 6/1997 |
| RU | 2102820 C1 | 1/1998 |
| RU | 2142175 C1 | 11/1999 |

* cited by examiner

*Primary Examiner* — David Nhu

(57) ABSTRACT

A silicon photomultiplier maintains the photon detection efficiency high while increasing a dynamic range, by reducing the degradation of an effective fill factor that follows the increase of cell number density intended for a dynamic range enhancement.

14 Claims, 6 Drawing Sheets

SILICON PHOTOMULTIPLIER WITH TRENCH ISOLATION

CROSS-REFERENCE TO RELATED APPLICATIONS

The present application claims priority to Korean patent application number 10-2010-0131869, filed on Dec. 21, 2010, which is incorporated by reference in its entirety.

BACKGROUND OF THE INVENTION

The present invention relates to a silicon photomultiplier having an improved performance through the structure improvement.

Typical silicon photomultipliers basically have a planar diode structure and is generally composed of doped layers of $p^+$-$p$-$n^+$ or $n^+$-$n$-$p^+$. As the reverse voltage applied to such a diode structure is increased, the depletion layer between $p^+$ and $n^+$ is expanded, and when the voltage becomes higher than the breakdown voltage, an electrical breakdown occurs.

The avalanche mode is an operation mode using the phenomenon that, when the above device operates as a photosensor with an applied voltage a little bit lower than the breakdown voltage, input photons are changed into pairs of charge carriers inside the semiconductor by photoexcitation, and then the charge carriers are multiplied by a gain of dozens to hundreds through the impact ionization occurring in consequence of carrier acceleration by the internal electrostatic field.

Meanwhile, it is possible that the breakdown actually does not occur immediately after a reverse bias higher than the breakdown voltage is applied, if there is no carrier excitation by external stimuli or thermal activation. When an avalanche photodiode is operated at a bias that exceeds the breakdown voltage, it is said to be in the Geiger mode. When a pair of charge carriers is generated by photoexcitation in the photodiode operating in Geiger mode, the carrier number may increases geometrically by successive impact ionization caused by the electrostatic field, and the stored charge in the diode structure may flow instantly. Through this phenomenon, very high current-to-photon gain can be obtained. Consequently, detection of a single photon incidence becomes possible.

The advantage of this operating method is that such highly sensitive detection of a single photon level signal is possible even with a relatively simple device structure. For this operating method, the device is composed of multiple cells of the diode connected in parallel, and the number of photons entered the device is determined by the strength of current pulse generated after the photon incidence.

Accordingly, the dynamic range of light intensity measurement for such a Geiger mode photomultiplier depends on the area of a single cell to the entire area of the device, and the number density of cells. Therefore, a cell pattern of high number density is required to increase the above dynamic range.

It should be noted that the cell diodes in the device need to be recovered from the breakdown in a short time. When an electrical breakdown occurs in a cell, the cell cannot operate for a while and if a large current continuously flows through the cell after the breakdown, the device may be damaged. To prevent this, a method of passive quenching that a quench resistor is connected in series to the diode structure of each cell is generally used. The quench resistor plays a role of quenching the breakdown and recovering the cell into a standby state, by inducing Ohmic voltage drop when instant current by the electrical breakdown flows, thereby momentarily reducing the voltage applied to the cell diode below the breakdown voltage.

FIG. 1 is a schematic plan view illustrating a conventional silicon photomultiplier device, and FIG. 2 is a cross-sectional view of the device in FIG. 1, taken along the line a-a'.

Referring to FIG. 1, it shows cell light-receiving parts 101, quench resistors 102, metal electrodes 103, and electrode contact parts 104.

A cell light-receiving part 101 of a silicon photomultiplier device comprises a planar diode structure, in which an electrical breakdown triggered by photoexcitation of charge carriers can occur.

The metal electrodes 103 connect upper bonding pads of a device to the quench resistors 102 and connect each quench resistor 102 with a diode part in the corresponding cell.

The electrode contact parts 104 represent contact areas formed to provide the metal electrodes 103 with electrical connection paths that pass through the insulating layer to other parts.

An entire device has a structure that plural cells are connected in parallel, as shown in FIG. 1.

Referring to FIG. 2, it shows a quench resistor 102, metal electrodes 103, an upper doped layer 105, an intermediate layer 106, a buried layer 107, an insulating layer 108, and a guard ring 109.

Here, the upper doped layer 105, the intermediate layer 106, and the buried layer 107 show the inside of the diode structure of the cell light-receiving parts 101 by dividing the structure according to the doping degree and the role.

The upper doped layer 105 is a part doped with $n^+$ and the impact ionization occurs most strongly right under this area.

The intermediate layer 106, which is a part lightly doped with p, corresponds to a part of the original substrate or is a part grown by silicon epitaxy after formation of the buried layer 107.

The buried layer 107 is a part doped with $p^+$ that operates at the same potential as that of the electrode under the substrate, and is formed by the high energy ion implantation, by silicon epitaxial growth with a high content of dopant, or by other diffusion methods.

The insulating layer 108 is generally formed of an insulator such as silicon dioxide or silicon nitride to protect the surface of the substrate and separate the substrate from the quench resistors 102 and the metal electrodes 103.

The guard ring 109 plays a role in preventing the premature breakdown by reducing the electric field strength near the edge portions of the upper doped layer 105.

A point to note when measuring the number of entered photons using such Geiger mode silicon photomultiplier is that the spreading of the effect of photon incidence signal generated from a cell to adjacent cells should be suppressed properly. When an electrical breakdown occurs in a cell by the avalanche phenomenon, a plurality of photons may be generated from the accompanying impact ionization, etc. It is known that out of photons generated from 100,000 impact ionization event, about 3 of them have higher energy than the silicon gap energy. If the high energy photons reach the adjacent cells, additional breakdowns can occur in the adjacent cells. If the probability of such an additional breakdown were close to 1, the breakdown would successively spread to the adjacent cells, making the multicell design of the device pointless.

Accordingly, to suppress such an optical crosstalk, a method of spacing cells diodes out from each other is generally used in the existing arts, and additionally, a method using a trench isolation structure has also been proposed.

A method for suppressing the optical crosstalk by widening the space between cell diodes as mentioned above may be the most natural solution. However, such a design is not adequate for silicon photomultipliers with small cell sizes. For a silicon photomultiplier with a relatively large cell number density and a small cell size, the effective light-sensing area in comparison to the entire device area is considerably reduced because of the area occupied by the above mentioned quench resistors, metal electrodes, and the space between the cell diodes. Such reduction of the effective fill factor deteriorates the photon detection efficiency of the device.

Accordingly, a trench isolation structure has ever been proposed to effectively block photons even when the space between the cell diodes is narrow. In this structure, photons leaking out to the adjacent cells are blocked by optical isolation trenches placed between the light-receiving cell diodes. The optical isolation is based on the reflection of light at interfaces between materials of different refractive indices. The trench structure is formed by etching the silicon substrate and covering the etched surface with a layer of insulating materials such as silicon dioxide or silicon nitride.

The technologies described above denote the background arts in the technical field to which the present invention belongs, and do not denote the conventional arts.

SUMMARY OF THE INVENTION

Embodiments of the present invention are directed to a silicon photomultiplier with trench isolation for maintaining the photon detection efficiency high while increasing the dynamic range of light intensity measurement, by reducing the degradation of the effective fill factor that follows the increase of cell number density intended for a dynamic range enhancement.

Embodiments of the present invention are also directed to a silicon photomultiplier with trench isolation for increasing the effective fill factor of a device by multifunctionalizing the trench structure.

Embodiments of the present invention are also directed to a silicon photomultiplier with trench isolation for additionally increasing the effective fill factor of a device and uniformizing the breakdown characteristics of the cell diodes, by improving the shape of cells and their arrangement in a device.

In one embodiment, a silicon photomultiplier includes a plurality of cell light-receiving parts where electrical breakdown occurs due to photoexcitation; and a trench formed between the plurality of cell light-receiving parts and separating the same, wherein the trench comprises trench resistors whose inside is filled with semiconductor or resistor and a trench isolation layer functioning as a wall of the trench.

The present invention may further comprise a trench divider electrically separating the trench into segments.

In the present invention, the depth of the trench is 20 to 80% of the depth of a buried layer of the silicon photomultiplier.

In the present invention, the distance between the trench resistor and the adjacent cell light-receiving part is formed to be 30 to 300% of the depth of the trench.

In the present invention, each of the cell light-receiving parts has a hexagonal shape and the cells are arranged in a hexagonal lattice.

In the present invention, the horizontal structure of the trench is formed in honeycomb structure.

In the present invention, the trench isolation layer comprises single or multi layers of silicon dioxide, silicon nitride, or other insulating materials.

As mentioned above, according to the present invention, the photo detection efficiency can be maintained high and the light intensity measurement dynamic range can be increased by reducing the deterioration of the effective fill factor inevitably following the cell number densification through the trench isolation structure.

In addition, the effective fill factor of a device can be increased and the performance can be improved by minimizing distances between cells through blocking photons leaking among cells by ameliorating the trench isolation structure and multifunctionalizing the trench to function as quench resistor and guard ring at the same time.

Further, it is possible to additionally increase the effective fill factor of a device and uniformize the breakdown characteristics of the light-receiving areas by using hexagonal cells in honeycomb arrangement to improve the cell shape and arrangement structure over the general quadrilateral structure.

DESCRIPTION OF SPECIFIC EMBODIMENTS

Figure 1:
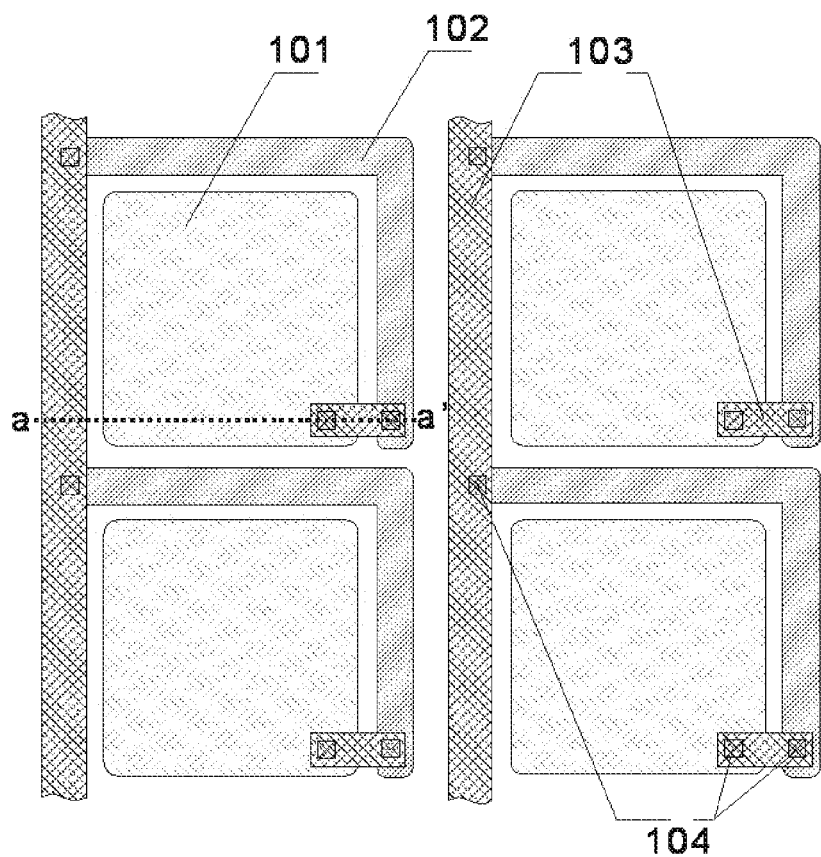
FIG. 1 illustrates a schematic plan view of a conventional silicon photomultiplier device.
Figure 2:
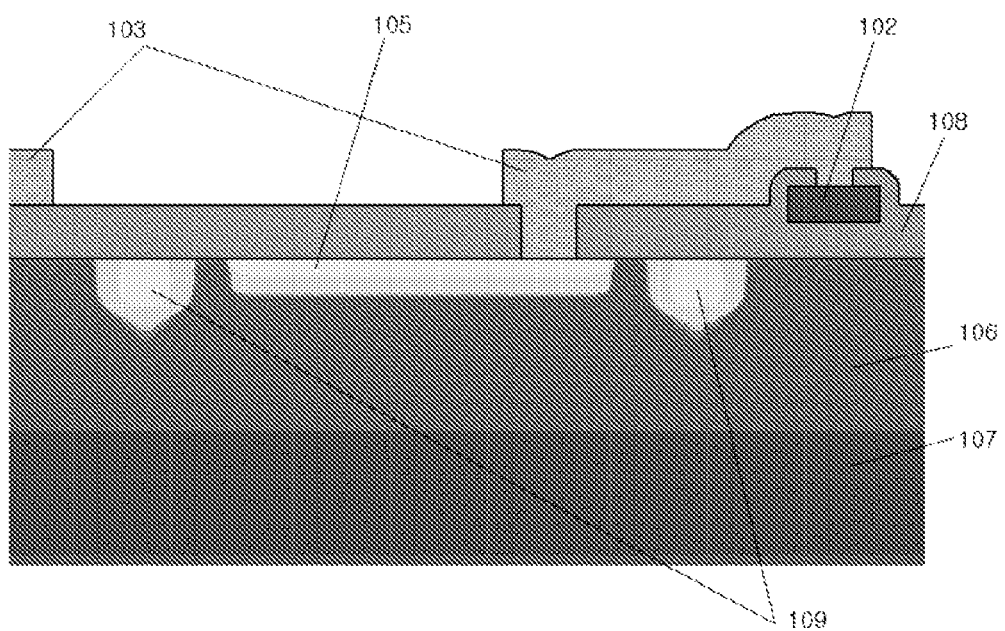
FIG. 2 illustrates a cross-sectional view of the device in FIG. 1, taken along the line a-a'.

Hereinafter, a silicon photomultiplier with trench isolation in accordance with the present invention will be described in detail with reference to the accompanying drawings. In the drawings, the thicknesses of lines or the sizes of elements may be exaggeratedly illustrated for clarity and convenience of description. Moreover, the terms used henceforth have been defined in consideration of the functions of the present invention, and may be altered according to the intent of a user or operator, or conventional practice. Therefore, the terms should be defined on the basis of the entire content of this specification.

Figure 3:
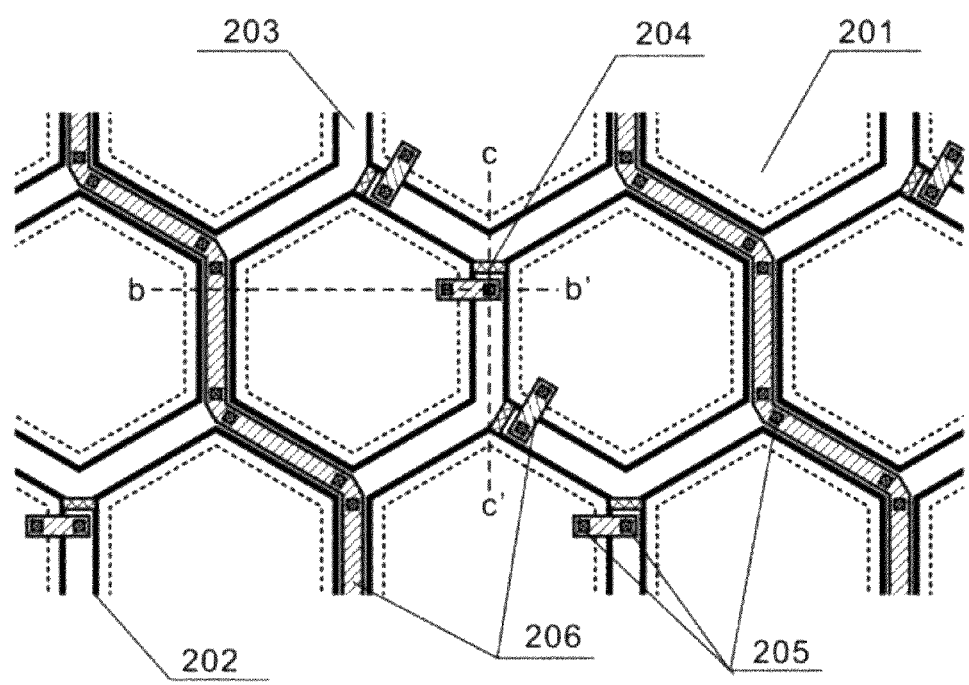
FIG. 3 illustrates a schematic plan view of a silicon photomultiplier according to an embodiment of the present invention.
Figure 4:
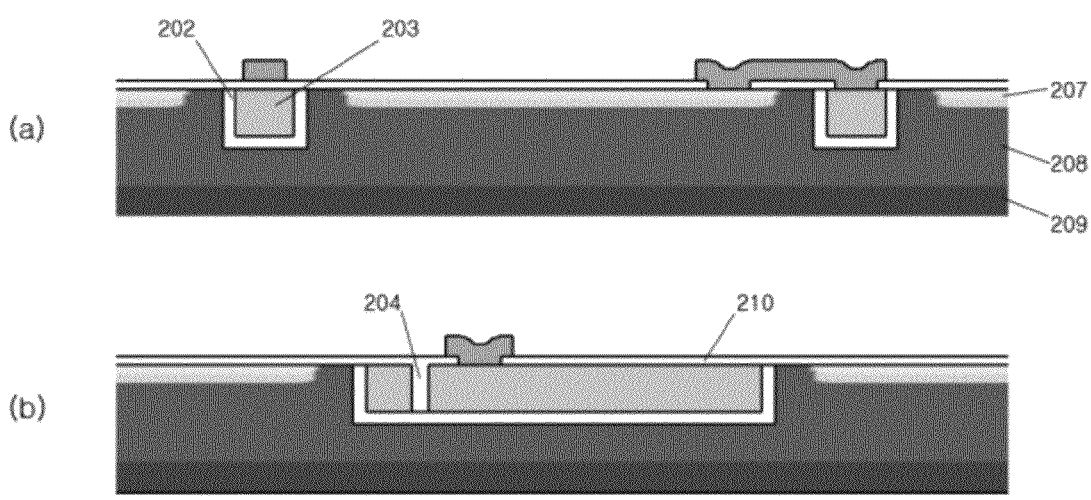
FIG. 4 illustrates a cross-sectional view of the device in FIG. 3, taken along the lines b-b' and c-c'.
Figure 5:
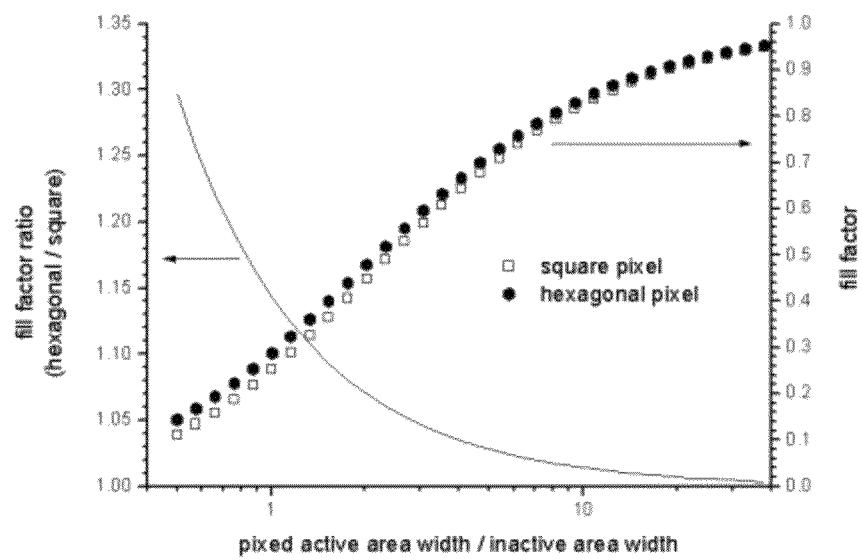
FIG. 5 illustrates a graph of the device fill factor comparing between hexagonal and square cell shape of the silicon photomultiplier.

FIG. 3 illustrates a schematic plan view of a silicon photomultiplier according to an embodiment of the present invention, FIG. 4 illustrates a cross-sectional view of the device in FIG. 3, taken along the lines b-b' and c-c', and FIG. 5 illustrates a graph of the device fill factor comparing between hexagonal and square cell of the silicon photomultiplier.

The doping structure of the silicon photomultiplier according to the one embodiment of the present invention is the same as that of the existing silicon photomultiplier composed of $n^+$-p-$p^+$ or $p^+$-n-$n^+$ layers in vertical direction, but the embodiment comprises isolation trench placed between cells. The trench is electrically insulated from the substrate with insulating walls, and filled with semiconductor such as polysilicon or resistor. The optical crosstalk between cells is suppressed by light reflection at the trench walls and light absorption inside the trench.

Referring to FIG. 3 and FIG. 4, they show cell light-receiving parts 201, trench isolation layers 202, trench resistors 203, trench dividers 204, electrode contact parts 205, metal electrodes 206, an upper doped layer 207, an intermediate layer 208, a buried layer 209, and an upper protection layer 210.

The cell light-receiving parts 201 are areas where the breakdown by the photoexcitation occurs.

The trench isolation layers 202 electrically insulate trench resistors 203 from the device substrate.

The trench isolation layer 202 does not only electrically insulate the quench resistor from the diode portion in a cell, but also blocks the optical crosstalk between cells through reflection caused by the difference in the refractive index between the insulating material and silicon.

The trench isolation layer 202 may consist of single or multi layers of silicon dioxide, silicon nitride, or other insulating materials.

The trench resistor 203 is composed of resistor or semiconductor such as polysilicon filling up the inside of the trench, and used as quench resistor connecting an upper metal electrode 206 and an upper doped layer 207 of a cell.

The trench dividers 204 are formed to electrically separate the network of trench into segments which are to be used as individual quench resistors.

The electrode contact parts 205 are formed to pass through the upper protection layers 210 for electrically connecting the trench resistors 203 with the cell light-receiving parts 201 and the metal electrodes 206 in series.

The metal electrodes 206 are formed for electric connection of the upper portion of a device.

According to the present embodiment, to use each trench resistor 203 as a quench resistor for an individual cell, the trench dividers 204 are formed in the network of trench, and later the electrode contact parts 205 are prepared on each trench resistor and the cell light-receiving part 201 to connect the trench resistor electrically with the upper doped layer of the cell light-receiving part 201 of each cell and the top electrode of the device.

The silicon photomultiplier according to the present embodiment has cell light-receiving parts 201 of hexagonal shape arranged in a hexagonal lattice.

First of all, the ratio of the inactive area between cells to the area of the cell light-receiving parts 201 can be minimized by the construction of hexagonal honeycomb arrangement.

Referring to FIG. 5, it shows a graph illustrating calculated fill factors and their ratios of a device of hexagonal cells and a device of square cells, both with the same ratio of cell light-receiving area width to the gap width between the cell light-receiving areas.

The graph shows that the higher fill factor can be obtained, in the case of a device of hexagonal cells, as the width of cell light-receiving area decreases in comparison to the distances between cells. Such decrease of cell width ratio generally results when the number density of cells is increased for a dynamic range enhancement.

Next, since the angle at every vertex where edges of the effective light-receiving part of a cell meet is 120 degrees for a hexagonal cell, that is, it is obtuse compared to that of a square cell, the corner field effect in areas near the vertices is eased, therefore the local breakdown voltage drop in the corresponding areas may be reduced.

To prevent the breakdown voltage drop at the edges of the light-receiving areas, a method of controlling the electric field distribution near the edges, such as forming a guard ring, is generally used. However, it can cause a side effect that the Geiger breakdown does not occur in the corresponding areas, that is, the reduction of the effective light-receiving area.

Accordingly, the hexagonal structure that can reduce the electric field gradient near the vertices of cells may have an effect that the reduction of the effective light-receiving area decreases as a result.

(a) in FIG. 4 illustrates a cross-sectional view of the device in FIG. 3, taken along the line b-b', and (b) in FIG. 4 illustrates a cross-sectional view of the same device, taken along the line c-c'.

The upper doped layer 207 is a part doped with $n^+$ and the impact ionization occurs the most strongly right under this area.

The intermediate layer 208 is a part lightly doped with p and the same corresponds to a part of the original substrate or is a part formed by silicon epitaxial growth after formation of the buried layer 209.

The buried layer 209 is a part doped with $p^+$ that operates at the same potential as that of the electrode under the substrate, and the same is formed by high energy ion implantation, by silicon epitaxial growth with a high content of dopant, or by other diffusion methods.

The upper protection layer 210 is a transparent insulator formed for protecting the device surface under the protection layer and additionally reducing the reflection of incidence light.

When applying the present invention in practice, the trench may be formed to function as a guard ring for reducing the edge field effect occurring near the edges of the upper doped layer 207 by properly adjusting the depth and the horizontal distance from the edges.

Here, the depth of the trench and the horizontal distance from the upper doped layer 207 should be determined with consideration of the depth of the buried layer 209, the doping degrees of the upper doped layer 207 and the buried layer 209, etc.

It is preferable that the depth of the trench is 20~80% of the depth of the buried layer 209 and the distance between the trench resistor 203 and the cell light-receiving part 201 of the adjacent cell is 30~300% of the depth of the trench structure.

Figure 6:
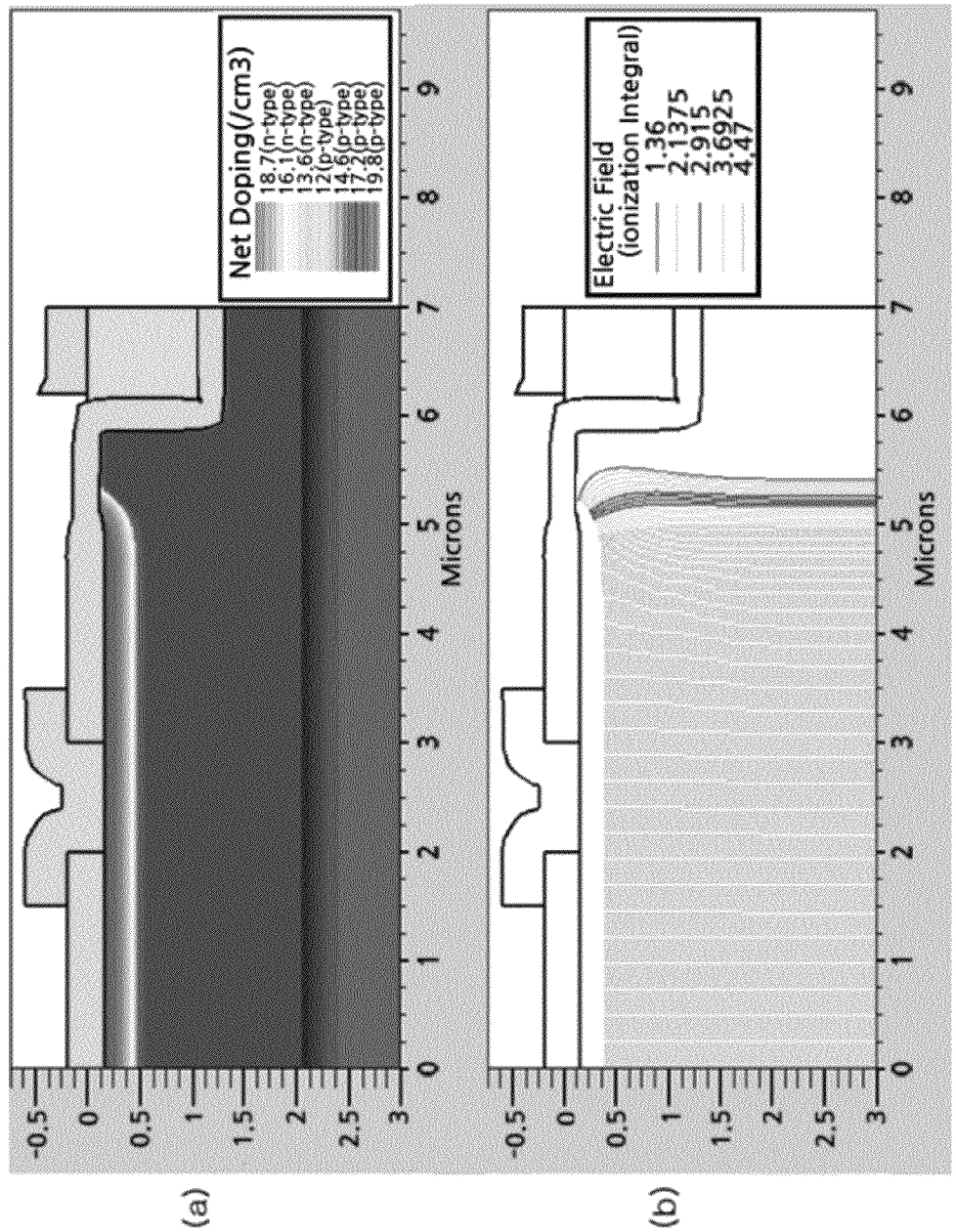
FIG. 6 illustrates a computer simulation result on a trench structure.

FIG. 6 illustrates a computer simulation result on a trench structure.

Referring to FIG. 6, it shows a computer simulation result of a device comprising the said trench structure formed to function properly as a guard ring.

(a) in FIG. 6 shows the size ratio and the doping distribution of a device structure used in the calculation, and (b) in FIG. 6 shows the path of avalanche current and the corresponding ionization integral at a voltage close to the breakdown value.

Here, it can be verified that a nearly uniform ionization integral is obtained right under the upper doped layer 207 except near the edge of the upper doped layer 207 where the ionization integral is lower. The lower ionization integral near the edge means that the premature breakdown that can occur near cell edges is effectively prevented in this structure. For the model device used in FIG. 6, the depth of the trench corresponds to 50% of the depth of the buried layer 209, and the distance between the trench resistor 203 and the adjacent cell light-receiving part 201 corresponds to 100% of the depth of the trench. However, if the distance is too close, the interface between the trench isolation layer 202 and the intermediate layer 208 may adversely affect the characteristics of the device.

According to the present embodiment, since the trench structure functions as a wall for blocking the optional crosstalk, a quench resistor, and a guard ring at the same time, the distance between cell light-receiving areas basically can be maintained to be short to improve the effective fill factor of a device, thus reducing the decrease of photon detection efficiency following the increase of cell number density of a device.

In addition, since the light-receiving parts are formed as a hexagonal lattice of hexagonal cells which make the cell boundary shape closer to a circle, the corner effect can be reduced and more uniform breakdown voltage distribution can be obtained while maximizing the light-receiving area, so that the photon detection efficiency can be enhanced, the effective fill factor can be additionally improved, and the premature breakdown near the edges of the upper doped layer can also be prevented.

While the present invention has been described with respect to the embodiments illustrated in the drawings, it is only illustrative and it will be apparent to those skilled in the art that various changes and modifications may be made without departing from the spirit and scope of the invention as defined in the following claims. Accordingly, the technical protection scope of the present invention should be defined by the following claims.

What is claimed is:

1. A silicon photomultiplier, comprising:
   a plurality of cell light-receiving parts where an electrical breakdown occurs due to photoexcitation; and
   a trench formed between the plurality of cell light-receiving parts to separate the plurality of cell light-receiving parts,
   wherein the trench comprises trench resistors and a trench isolation layer, the trench resistors filling an inside of the trench with a semiconductor or resistor, the trench isolation layer covering bottom surfaces and sidewalls of the trench resistors to function as a wall of the trench.

2. The silicon photomultiplier of claim 1, further comprising:
   a trench divider electrically separating the trench into segments.

3. The silicon photomultiplier of claim 1, wherein a depth of the trench is around 20% to 80% of a depth of a buried layer of the silicon photomultiplier.

4. The silicon photomultiplier of claim 1, wherein a distance between the trench resistor and a cell light-receiving part adjacent thereto ranges from around 30% to 300% of a depth of the trench.

5. The silicon photomultiplier of claim 1, wherein each of the cell light-receiving parts has a hexagonal shape, and the cell light-receiving parts are arranged in a hexagonal lattice.

6. The silicon photomultiplier of claim 5, wherein the trench has a honeycomb structure.

7. The silicon photomultiplier of claim 1, wherein the trench isolation layer comprises single or multiple layers of any of silicon dioxide, silicon nitride, and other insulating materials.

8. A silicon photomultiplier, comprising:
   a plurality of cell light-receiving parts where an electrical breakdown occurs due to photoexcitation;
   a trench formed between the plurality of cell light-receiving parts to separate the plurality of cell light-receiving parts; and
   a trench divider electrically separating the trench into segments.

9. The silicon photomultiplier of claim 8,
   wherein the trench comprises trench resistors, trench resistors filling an inside of the trench with a semiconductor or resistor, and a trench isolation layer functioning as a wall of the trench.

10. The silicon photomultiplier of claim 8, wherein a depth of the trench is around 20% to 80% of a depth of a buried layer of the silicon photomultiplier.

11. The silicon photomultiplier of claim 9, wherein a distance between the trench resistor and a cell light-receiving part adjacent thereto ranges from around 30% to 300% of a depth of the trench.

12. The silicon photomultiplier of claim 8, wherein each of the cell light-receiving parts has a hexagonal shape, and the cell light-receiving parts are arranged in a hexagonal lattice.

13. The silicon photomultiplier of claim 12, wherein the trench has a honeycomb structure.

14. The silicon photomultiplier of claim 9, wherein the trench isolation layer comprises single or multiple layers of any of silicon dioxide, silicon nitride, and other insulating materials.

* * * * *